US012811403B2

(12) United States Patent
Young

(10) Patent No.: US 12,811,403 B2
(45) Date of Patent: Nov. 24, 2026

(54) STORAGE SYSTEM CONFIGURED FOR USE WITH AN ENERGY MANAGEMENT SYSTEM

(71) Applicant: Enphase Energy, Inc., Petaluma, CA (US)

(72) Inventor: Chris Morrow Young, Round Rock, TX (US)

(73) Assignee: Enphase Energy, Inc., Petaluma, CA (US)

( * ) Notice: Subject to any disclaimer, the term of this patent is extended or adjusted under 35 U.S.C. 154(b) by 364 days.

(21) Appl. No.: 18/140,318

(22) Filed: Apr. 27, 2023

(65) Prior Publication Data

US 2023/0369861 A1 Nov. 16, 2023

Related U.S. Application Data

(60) Provisional application No. 63/341,704, filed on May 13, 2022.

(51) Int. Cl.

| | |
|---|---|
| ***H02J 3/32*** | (2026.01) |
| ***G01R 31/36*** | (2020.01) |
| ***H02J 3/46*** | (2006.01) |
| ***H02J 7/52*** | (2026.01) |
| *G01R 31/382* | (2019.01) |

(52) U.S. Cl.

CPC ............ *H02J 3/32* (2013.01); *G01R 31/3648* (2013.01); *H02J 3/46* (2013.01); *H02J 7/52* (2026.01); *G01R 31/382* (2019.01)

(58) Field of Classification Search

None

See application file for complete search history.

(56) References Cited

U.S. PATENT DOCUMENTS

| | | | | |
|---|---|---|---|---|
| 2006/0164039 A1* | 7/2006 | Ukon | G01R 31/3648 | 320/132 |
| 2011/0101913 A1* | 5/2011 | Matsumoto | H01M 10/441 | 320/162 |
| 2013/0300374 A1* | 11/2013 | Tomita | H01M 10/42 | 320/134 |
| 2014/0062394 A1* | 3/2014 | Khan | B60L 53/11 | 320/108 |

(Continued)

FOREIGN PATENT DOCUMENTS

| | | |
|---|---|---|
| JP | 2013-542706 A | 11/2013 |
| JP | 2015-176304 A | 10/2015 |

(Continued)

OTHER PUBLICATIONS

PCT International Search Report and Written Opinion for Application No. PCT/US2023/020517 dated Aug. 21, 2023, 9 pgs.

*Primary Examiner* — Hua Lu

(74) *Attorney, Agent, or Firm* — Moser Taboada

(57) ABSTRACT

A storage system configured for use with an energy management system is provided and includes a plurality of single-phase AC coupled batteries or three-phase AC coupled batteries and a controller configured to determine a time remaining before each battery of the plurality of single-phase AC coupled batteries or the three-phase AC coupled batteries is depleted for power balancing the plurality of single-phase AC coupled batteries or the three-phase AC coupled batteries.

15 Claims, 8 Drawing Sheets

(56) References Cited

U.S. PATENT DOCUMENTS

| | | | | |
|---|---|---|---|---|
| 2014/0355308 | A1* | 12/2014 | Uan-Zo-Li .............. | H02M 5/32<br>363/125 |
| 2015/0115892 | A1* | 4/2015 | Chen ......................... | H02J 7/52<br>320/134 |
| 2015/0214754 | A1* | 7/2015 | Choi ................... | H02J 3/00144<br>320/134 |
| 2018/0145531 | A1* | 5/2018 | Jung .................... | G01R 31/374 |
| 2018/0366948 | A1* | 12/2018 | Lehn .......................... | H02J 1/10 |
| 2021/0138876 | A1* | 5/2021 | Vanous .............. | B60H 1/00428 |
| 2021/0173635 | A1* | 6/2021 | Shin ................... | G01R 31/3647 |
| 2021/0259517 | A1* | 8/2021 | Ubbesen .............. | A61B 1/0005 |
| 2021/0281093 | A1* | 9/2021 | Elidrissi ................ | A61M 5/142 |
| 2023/0024900 | A1* | 1/2023 | Ayoola .................. | B60L 53/302 |
| 2023/0122362 | A1* | 4/2023 | Shoa Hassani Lashidani ............ | G01K 1/143<br>702/63 |
| 2023/0186191 | A1* | 6/2023 | Lane .................... | G01R 31/392<br>705/7.13 |
| 2023/0204672 | A1* | 6/2023 | Wang ................... | G01R 31/382<br>324/432 |
| 2023/0344258 | A1* | 10/2023 | Arimura ................. | B60L 53/62 |
| 2023/0413181 | A1* | 12/2023 | Song ................... | H04W 52/028 |
| 2024/0151775 | A1* | 5/2024 | Wang ................... | G01R 31/382 |

FOREIGN PATENT DOCUMENTS

| | | | |
|---|---|---|---|
| JP | 2016 220352 | A | 12/2016 |
| JP | 6781637 | B2 | 11/2020 |
| KR | 10-1494848 | B1 | 2/2015 |

* cited by examiner

STORAGE SYSTEM CONFIGURED FOR USE WITH AN ENERGY MANAGEMENT SYSTEM

CROSS-REFERENCE TO RELATED APPLICATIONS

The present application claims the benefit and priority to U.S. Provisional Patent Application Ser. No. 63/341,704, filed on May 13, 2022, the entire contents of which is incorporated herein by reference.

BACKGROUND

1. Field of the Disclosure

Embodiments of the present disclosure generally relate to power systems and, more particularly, to storage systems configured for use with energy management systems.

2. Description of the Related Art

Conventional AC storage systems provide a required energy storage (kWh) and a required AC power (kW). A typical AC storage system requirement for power needed is a function of the required energy storage for a collection of houses. For example, for residential AC storage systems, a house that needs a storage capability of 5 kWh may only need a continuous power capability up to 5 kW (e.g., 5 kW inverter). Conversely, a house that needs a storage capability of 20 kWh may need a continuous power capability of 9 kW. A typical curve of continuous power capability as a function of the totaled stored energy can be defined as: $P=P_o+k*E$, where $P_o$ is a minimum continuous power, k is storage power conversion factor, E is a maximum stored energy for the AC storage system. $P_o$ (e.g., given a collection of houses, which have negligible energy storage needs) is typically a non-zero value and k can be a slope of the curve. Thus, for four hour storage, the slope can be roughly 0.25, and for 24 hour storage, the slope can be roughly 0.07. A C-rate can also be defined in the curve as a rated power divided by a stored energy. For example, if a required power is 9 kW and a stored energy is 20 kWh, the C-rate can be 0.45 (e.g., 9 kW/20 kWh).

However, as modular AC power storage systems can be scalable depending on a user's storage needs, choosing an optimal inverter can sometimes be difficult to achieve. For example, if a user requires 20 kWh of storage capability and a user opts to use a 5 kWh storage size module, four 5 kWh storage size modules would be required, each using a 5 kW inverter. The continuous power capability of such an AC power storage systems is 20 kW (e.g., four*5 kW), which is more than twice of the 9 kW total continuous power capability required, with the associated extra cost for the AC power storage system that is now oversized in terms of power. Additionally, if a user were to opt for a 20 kWh storage size module, a single 9 kW inverter could be used, but such an AC power storage system would be too large and overly expensive for AC power storage systems needing less than 20 kWh.

Therefore, an optimal system may actually have a combination of AC battery modules with differing C-rates to optimally be configured to provide the needed power and the needed energy. Given that the AC battery modules may differ in an ability to provide power, a balancing system is needed to ensure that the batteries provide power at a rate that ensures that they all run out of energy at approximately the same time.

SUMMARY

In accordance with some aspects of the present disclosure, a storage system configured for use with an energy management system comprises a plurality of single-phase AC coupled batteries or three-phase AC coupled batteries and a controller configured to determine a time remaining before each battery of the plurality of single-phase AC coupled batteries or the three-phase AC coupled batteries is depleted for power balancing the plurality of single-phase AC coupled batteries or the three-phase AC coupled batteries.

In accordance with some aspects of the present disclosure, a method for managing a storage system configured for use with an energy management system comprises determining a time remaining before each battery of a plurality of single-phase AC coupled batteries or the three-phase AC coupled batteries is depleted and balancing a power of the plurality of single-phase AC coupled batteries or the three-phase AC coupled batteries.

In accordance with some aspects of the present disclosure, a non-transitory computer readable storage medium having stored thereon instructions that when executed by a processor perform a method for managing a storage system configured for use with an energy management system comprises determining a time remaining before each battery of a plurality of single-phase AC coupled batteries or the three-phase AC coupled batteries is depleted and balancing a power of the plurality of single-phase AC coupled batteries or the three-phase AC coupled batteries.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only a typical embodiment of this disclosure and are therefore not to be considered limiting of its scope, for the disclosure may admit to other equally effective embodiments.

DETAILED DESCRIPTION

In accordance with the present disclosure, methods and apparatus configured for use with energy management systems are disclosed herein. For example, a storage system can comprise a plurality of single-phase AC coupled batteries or three-phase AC coupled batteries. A controller is configured to determine a time remaining before each battery of the plurality of single-phase AC coupled batteries or the three-phase AC coupled batteries is depleted for power balancing the plurality of single-phase AC coupled batteries or the three-phase AC coupled batteries. The methods and apparatus described herein provide significant cost advantages over conventional methods and apparatus by delivering power and energy more closely aligned to a user's needs. Additionally, battery balancing methods described herein add little to no cost to already installed energy management systems for power conversion.

Figure 1:
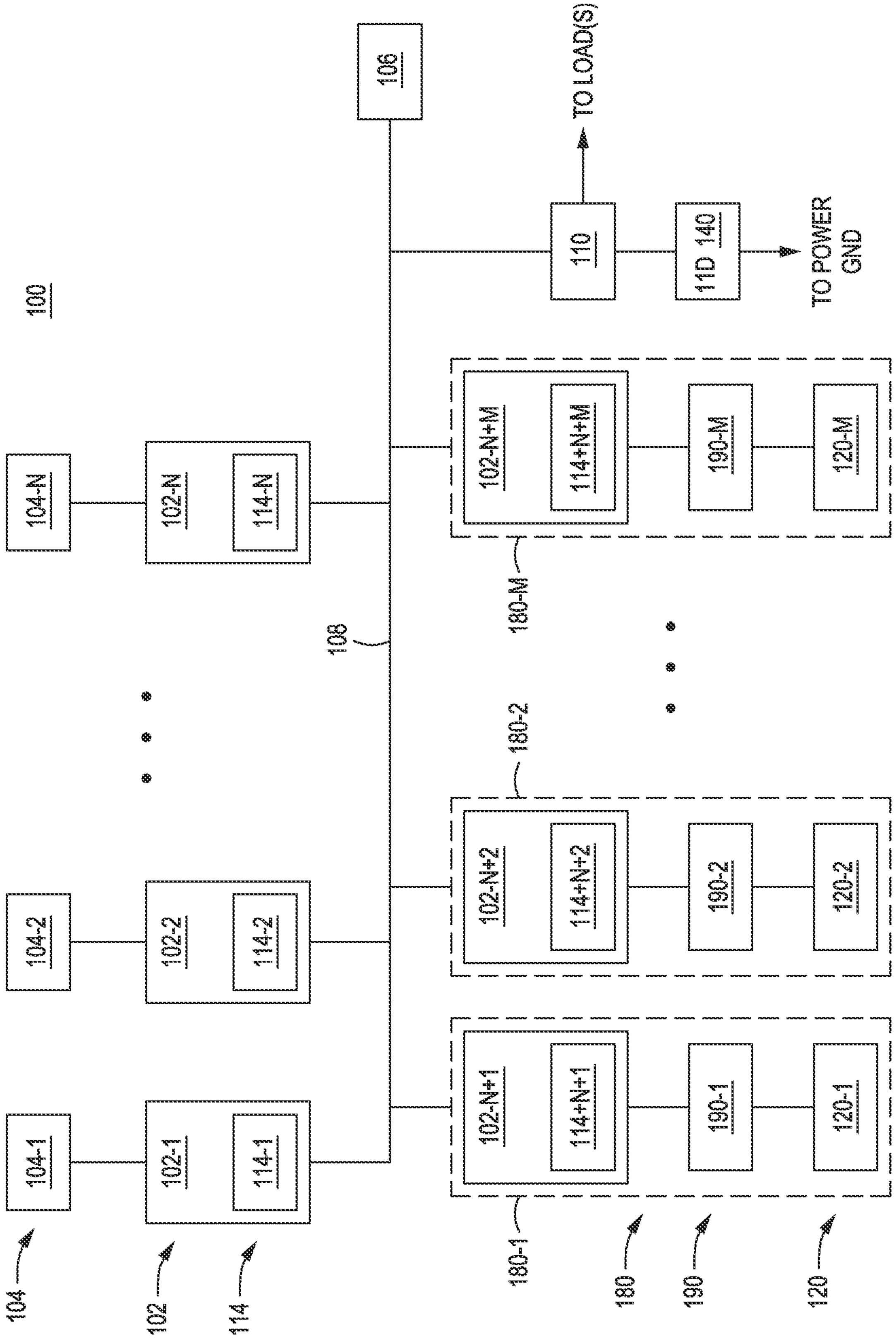
FIG. 1 is a block diagram of a system for power conversion, in accordance with at least some embodiments of the present disclosure.

FIG. 1 is a block diagram of an energy management system (a system 100) for power conversion using one or more embodiments of the present disclosure. This diagram only portrays one variation of the myriad of possible system configurations and devices that may utilize the present disclosure.

The system 100 is a microgrid that can operate in both an islanded state and in a grid-connected state (i.e., when connected to another power grid (such as one or more other microgrids and/or a commercial power grid). The system 100 comprises a plurality of power converters (which also may be called power conditioners) 102-1, 102-2, . . . 102-N, 102-N+1, and 102-N+M collectively referred to as power converters 102; a plurality of DC power sources 104-1, 104-2, . . . 104-N, collectively referred to as power sources 104; a plurality of energy storage devices/delivery devices 120-1, 120-2, . . . 120-M collectively referred to as energy storage/delivery devices 120; a system controller 106; a plurality of battery management units (BMUs) 190-1, 190-2, . . . 190-M collectively referred to as BMUs 190; a system controller 106; a bus 108; a load center 110; and an island interconnect device (IID) 140 (which may also be referred to as a microgrid interconnect device (MID)). In some embodiments, such as the embodiments described herein, the energy storage/delivery devices are rechargeable batteries (e.g., multi-C-rate collection of AC batteries) which may be referred to as batteries 120, although in other embodiments the energy storage/delivery devices may be any other suitable device for storing energy and providing the stored energy. Generally, each of the batteries 120 comprises a plurality cells that are coupled in series, e.g., eight cells coupled in series to form a battery 120.

Each power converter 102-1, 102-2 . . . 102-N is coupled to a DC power source 104-1, 104-2 . . . 104-N, respectively, in a one-to-one correspondence, although in some other embodiments multiple DC power sources 104 may be coupled to one or more of the power converters 102. The power converters 102-N+1, 102-N+2 . . . 102-N+M are respectively coupled to plurality of energy storage devices/delivery devices 120-1, 120-2 . . . 120-M via BMUs 190-1, 190-2 . . . 190-M to form AC batteries 180-1, 180-2 . . . 180-M, respectively. Each of the power converters 102-1, 102-2 . . . 102-N+M comprises a corresponding controller 114-1, 114-2 . . . 114-N+M (collectively referred to as the inverter controllers 114) for controlling operation of the corresponding power converters 102-1, 102-2 . . . 102-N+M.

In some embodiments, such as the embodiment described below, the DC power sources 104 are DC power sources and the power converters 102 are bidirectional inverters such that the power converters 102-1 . . . 102-N convert DC power from the DC power sources 104 to grid-compliant AC power that is coupled to the bus 108, and the power converters 102-N+1 . . . 102-N+M convert (during energy storage device discharge) DC power from the batteries 120 to grid-compliant AC power that is coupled to the bus 108 and also convert (during energy storage device charging) AC power from the bus 108 to DC output that is stored in the batteries 120 for subsequent use. The DC power sources 104 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power. In other embodiments the power converters 102 may be other types of converters (such as DC-DC converters), and the bus 108 is a DC power bus.

The power converters 102 are coupled to the system controller 106 via the bus 108 (which also may be referred to as an AC line or a grid). The system controller 106 generally comprises a CPU coupled to each of support circuits and a memory that comprises a system control module for controlling some operational aspects of the system 100 and/or monitoring the system 100 (e.g., issuing certain command and control instructions to one or more of the power converters 102, collecting data related to the performance of the power converters 102, and the like). The system controller 106 is capable of communicating with the power converters 102 by wireless and/or wired communication (e.g., power line communication) for providing certain operative control and/or monitoring of the power converters 102.

In some embodiments, the system controller 106 may be a gateway that receives data (e.g., performance data) from the power converters 102 and communicates (e.g., via the Internet) the data and/or other information to a remote device or system, such as a master controller (not shown). Additionally or alternatively, the gateway may receive information from a remote device or system (not shown) and may communicate the information to the power converters 102 and/or use the information to generate control commands that are issued to the power converters 102.

The power converters 102 are coupled to the load center 110 via the bus 108, and the load center 110 is coupled to the power grid via the IID 140. When coupled to the power grid (e.g., a commercial grid or a larger microgrid) via the IID 140, the system 100 may be referred to as grid-connected; when disconnected from the power grid via the IID 140, the system 100 may be referred to as islanded. The IID 140 determines when to disconnect from/connect to the power grid (e.g., the IID 140 may detect a grid fluctuation, disturbance, outage or the like) and performs the disconnection/connection. Once disconnected from the power grid, the system 100 can continue to generate power as an intentional island, without imposing safety risks on any line workers that may be working on the grid, using the droop control techniques described herein. The IID 140 comprises a disconnect component (e.g., a disconnect relay) for physically disconnecting/connecting the system 100 from/to the power grid. In some embodiments, the IID 140 may additionally comprise an autotransformer for coupling the power system 100 to a split-phase load that may have a misbalance in it with some neutral current. In certain embodiments, the system controller 106 comprises the IID 140 or a portion of the IID 140.

The power converters 102 convert the DC power from the DC power sources 104 and discharging batteries 120 to grid-compliant AC power and couple the generated output power to the load center 110 via the bus 108. The power is then distributed to one or more loads (for example to one or more appliances) and/or to the power grid (when connected to the power grid). Additionally or alternatively, the generated energy may be stored for later use, for example using batteries, heated water, hydro pumping, $H_2O$-to-hydrogen conversion, or the like. Generally, the system 100 is coupled to the commercial power grid, although in some embodiments the system 100 is completely separate from the commercial grid and operates as an independent microgrid.

In some embodiments, the AC power generated by the power converters 102 is single-phase AC power. In other embodiments, the power converters 102 generate three-phase AC power.

Figure 2:
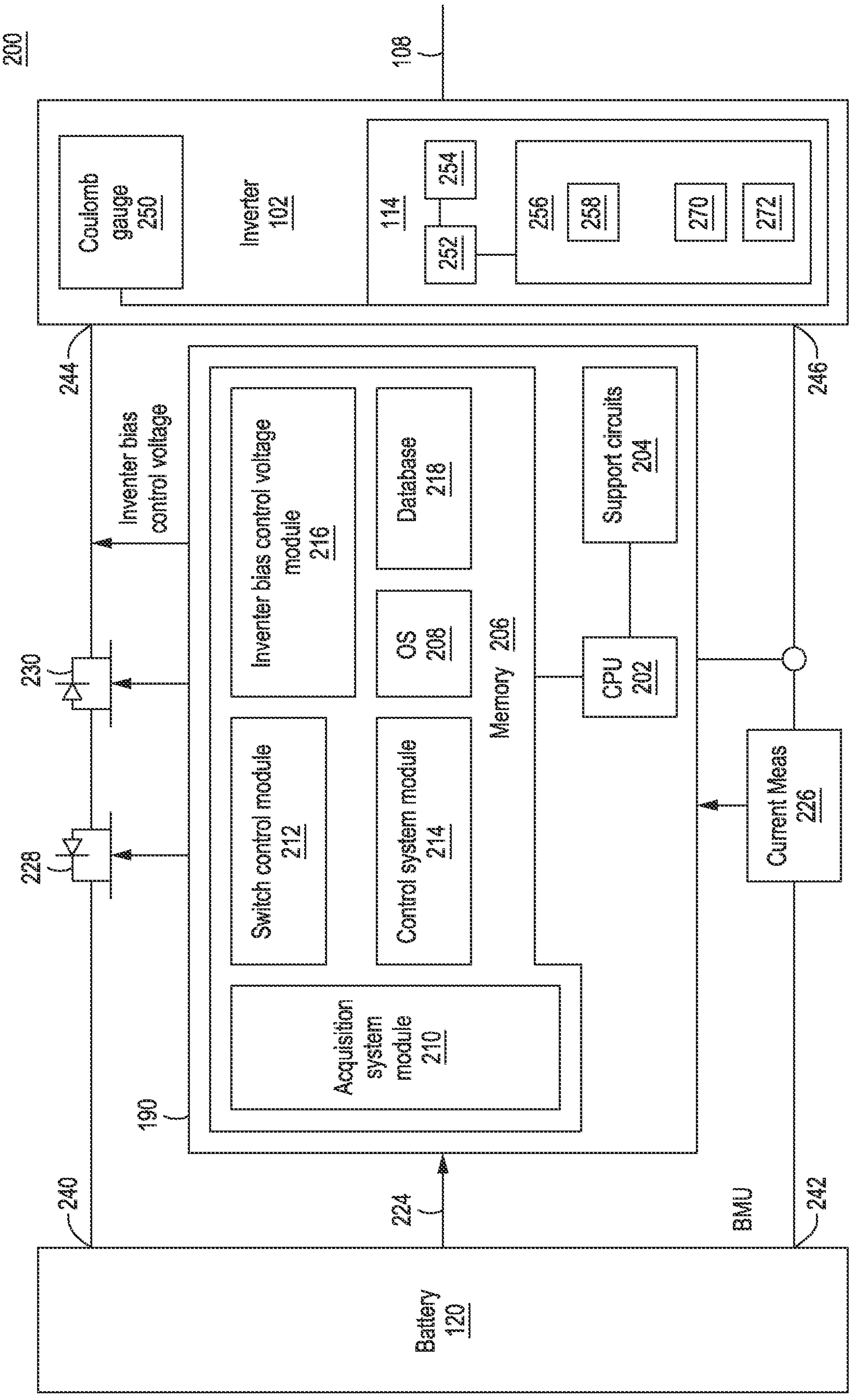
FIG. 2 is a block diagram of an AC battery system, in accordance with at least some embodiments of the present disclosure.

A storage system configured for use with an energy management system, such as the Enphase® Energy System, is described herein. For example, FIG. 2 is a block diagram of an AC battery system 200 (e.g., a storage system) in accordance with one or more embodiments of the present disclosure.

The AC battery system 200 comprises a BMU 190 coupled to a battery 120 and an inverter 102. A pair of metal-oxide-semiconductor field-effect transistors (MOSFETs) switches—switches 228 and 230—are coupled in series between a first terminal 240 of the battery 120 and a first terminal of the inverter 144 such the body diode cathode terminal of the switch 228 is coupled to the first terminal 240 of the battery 120 and the body diode cathode terminal of the switch 230 is coupled to the first terminal 244 of the inverter 102. The gate terminals of the switches 228 and 230 are coupled to the BMU 190.

A second terminal 242 of the battery 120 is coupled to a second terminal 246 of the inverter 102 via a current measurement module 226 which measures the current flowing between the battery 120 and the inverter 102.

The BMU 190 is coupled to the current measurement module 226 for receiving information on the measured current, and also receives an input 224 from the battery 120 indicating the battery cell voltage and temperature. The BMU 190 is coupled to the gate terminals of each of the switches 228 and 230 for driving the switch 228 to control battery discharge and driving the switch 230 to control battery charge as described herein. The BMU 190 is also coupled across the first terminal 244 and the second terminal 246 for providing an inverter bias control voltage (which may also be referred to as a bias control voltage) to the inverter 102 as described further below.

The configuration of the body diodes of the switches 228 and 230 allows current to be blocked in one direction but not the other depending on state of each of the switches 228 and 230. When the switch 228 is active (i.e., on) while the switch 230 is inactive (i.e., off), battery discharge is enabled to allow current to flow from the battery 120 to the inverter 102 through the body diode of the switch 230. When the switch 228 is inactive while the switch 230 is active, battery charge is enabled to allow current flow from the inverter 102 to the battery 120 through the body diode of the switch 228. When both switches 228 and 230 are active, the system is in a normal mode where the battery 120 can be charged or discharged.

The BMU 190 comprises support circuits 204 and a memory 206 (e.g., non-transitory computer readable storage medium), each coupled to a central processing unit (CPU) 202. The CPU 202 may comprise one or more processors, microprocessors, microcontrollers and combinations thereof configured to execute non-transient software instructions to perform various tasks in accordance with embodiments of the present disclosure. The CPU 202 may additionally or alternatively include one or more application specific integrated circuits (ASICs). In some embodiments, the CPU 202 may be a microcontroller comprising internal memory for storing controller firmware that, when executed, provides the controller functionality described herein. The BMU 190 may be implemented using a general purpose computer that, when executing particular software, becomes a specific purpose computer for performing various embodiments of the present disclosure.

The support circuits 204 are well known circuits used to promote functionality of the CPU 202. Such circuits include, but are not limited to, a cache, power supplies, clock circuits, buses, input/output (I/O) circuits, and the like. The BMU 190 may be implemented using a general purpose computer that, when executing particular software, becomes a specific purpose computer for performing various embodiments of the present disclosure. In one or more embodiments, the CPU 202 may be a microcontroller comprising internal memory for storing controller firmware that, when executed, provides the controller functionality described herein.

The memory 206 may comprise random access memory, read only memory, removable disk memory, flash memory, and various combinations of these types of memory. The memory 206 is sometimes referred to as main memory and may, in part, be used as cache memory or buffer memory. The memory 206 generally stores the operating system (OS) 208, if necessary, of the inverter controller 114 that can be supported by the CPU capabilities. In some embodiments, the OS 208 may be one of a number of commercially available operating systems such as, but not limited to, LINUX, Real-Time Operating System (RTOS), and the like.

The memory 206 stores non-transient processor-executable instructions and/or data that may be executed by and/or used by the CPU 202 to perform, for example, one or more methods for discharge protection, as described in greater detail below. These processor-executable instructions may comprise firmware, software, and the like, or some combination thereof. The memory 206 stores various forms of application software, such as an acquisition system module 210, a switch control module 212, a control system module 214, and an inverter bias control module 216. The memory 206 additionally stores a database 218 for storing data related to the operation of the BMU 190 and/or the present disclosure, such as one or more thresholds, equations, formulas, curves, and/or algorithms for the control techniques described herein. In various embodiments, one or more of the acquisition system module 210, the switch control module 212, the control system module 214, the inverter bias control module 216, and the database 218, or portions thereof, are implemented in software, firmware, hardware, or a combination thereof.

The acquisition system module 210 obtains the cell voltage and temperature information from the battery 120 via the input 224, obtains the current measurements provided by the current measurement module 226, and provides the cell voltage, cell temperature, and measured current information to the control system module 214 for use as described herein.

The switch control module 212 drives the switches 228 and 230 as determined by the control system module 214. The control system module 214 provides various battery management functions, including protection functions (e.g., overcurrent (OC) protection, overtemperature (OT) protection, and hardware fault protection), metrology functions (e.g., averaging measured battery cell voltage and battery current over, for example, 100 ms to reject 50 and 60 Hz ripple), state of charge (SOC) analysis (e.g., coulomb gauge 250 for determining current flow and utilizing the current flow in estimating the battery SOC; synchronizing estimated SOC values to battery voltages (such as setting SOC to an upper bound, such as 100%, at maximum battery voltage; setting SOC to a lower bound, such as 0%, at a minimum battery voltage); turning off SOC if the inverter 102 never drives the battery 120 to these limits; and the like), balancing (e.g., autonomously balancing the charge across all cells of a battery to be equal, which may be done at the end of charge, at the end of discharge, or in some embodiments both at the end of charge and the end of discharge). By establishing upper and lower estimated SOC bounds based on battery end of charge and end of discharge, respectively, and tracking the current flow and cell voltage (i.e., battery voltage) between these events, the BMU 190 determines the estimated SOC.

The inverter controller 114 comprises support circuits 254 and a memory 256, each coupled to a central processing unit (CPU) 252. The CPU 252 may comprise one or more processors, microprocessors, microcontrollers and combinations thereof configured to execute non-transient software instructions to perform various tasks in accordance with embodiments of the present disclosure. The CPU 252 may additionally or alternatively include one or more application specific integrated circuits (ASICs). In some embodiments, the CPU 252 may be a microcontroller comprising internal memory for storing controller firmware that, when executed, provides the controller functionality herein. The inverter controller 114 may be implemented using a general purpose computer that, when executing particular software, becomes a specific purpose computer for performing various embodiments of the present disclosure.

The support circuits 254 are well known circuits used to promote functionality of the CPU 252. Such circuits include, but are not limited to, a cache, power supplies, clock circuits, buses, input/output (I/O) circuits, and the like. The inverter controller 114 may be implemented using a general purpose computer that, when executing particular software, becomes a specific purpose computer for performing various embodiments of the present disclosure. In one or more embodiments, the CPU 252 may be a microcontroller comprising internal memory for storing controller firmware that, when executed, provides the controller functionality described herein.

The memory 256 may comprise random access memory, read only memory, removable disk memory, flash memory, and various combinations of these types of memory. The memory 256 is sometimes referred to as main memory and may, in part, be used as cache memory or buffer memory. The memory 256 generally stores the operating system (OS) 258, if necessary, of the inverter controller 114 that can be supported by the CPU capabilities. In some embodiments, the OS 258 may be one of a number of commercially available operating systems such as, but not limited to, LINUX, Real-Time Operating System (RTOS), and the like.

The memory 256 stores non-transient processor-executable instructions and/or data that may be executed by and/or used by the CPU 252. These processor-executable instructions may comprise firmware, software, and the like, or some combination thereof. The memory 256 stores various forms of application software, such as a power conversion control module 270 for controlling the bidirectional power conversion, and a battery management control module 272.

The BMU 190 communicates with the system controller 106 to perform balancing of the batteries 120 (e.g., multi-C-rate collection of AC batteries) based on a time remaining before each of the batteries are depleted of charge, to perform droop control (semi-passive) which allows the batteries to run out of charge at substantially the same time, and perform control of the batteries to charge batteries having less time remaining before depletion using batteries having more time remaining before depletion, as described in greater detail below.

Figure 3:
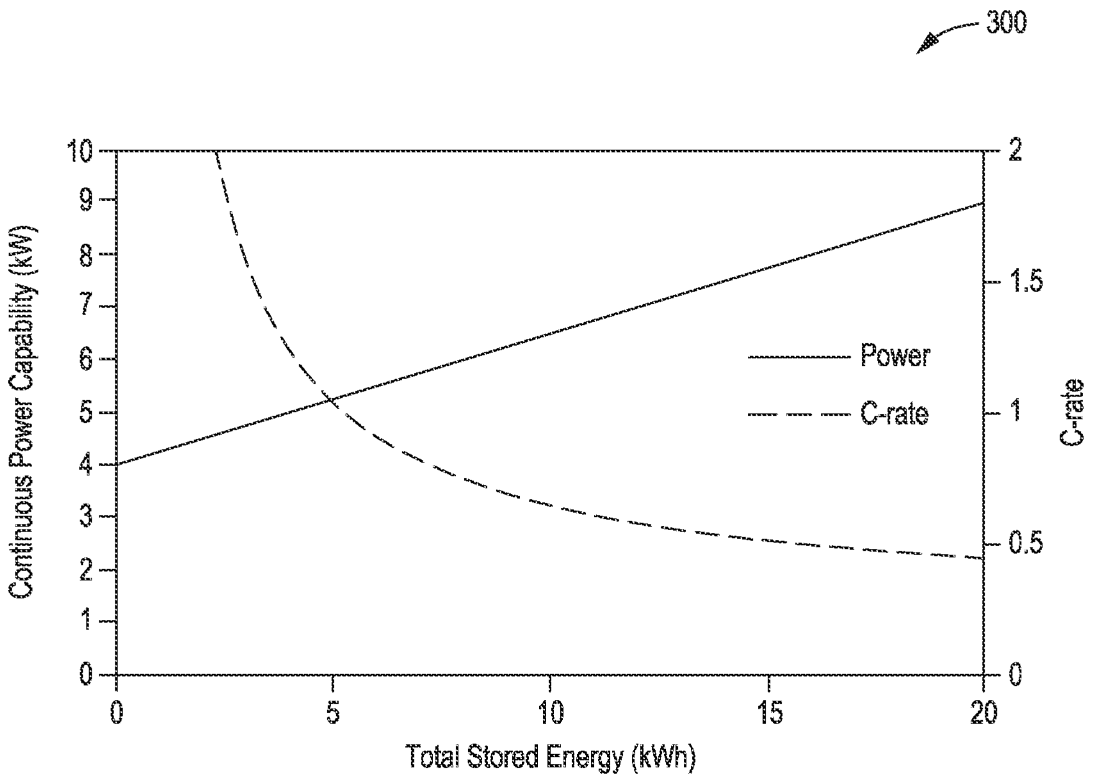
FIG. 3 is a graph of continuous power capability vs. total stored energy, in accordance with at least some embodiments of the present disclosure.

FIG. 3 is a graph 300 of continuous power capability vs. total stored energy, in accordance with at least one embodiment of the present disclosure. As shown in FIG. 3, a storage system (e.g., multiple C-rate batteries) can have a continuous power capability (e.g., kW) and a total stored energy (kWh). Additionally, as noted above, a C-rate can also be defined in the curve as a rated power divided by a stored energy. For example, if a required power is 5 kW and a stored energy is 5 kWh, the C-rate can be 1 (e.g., 5 kW/5 kWh).

Figure 4:
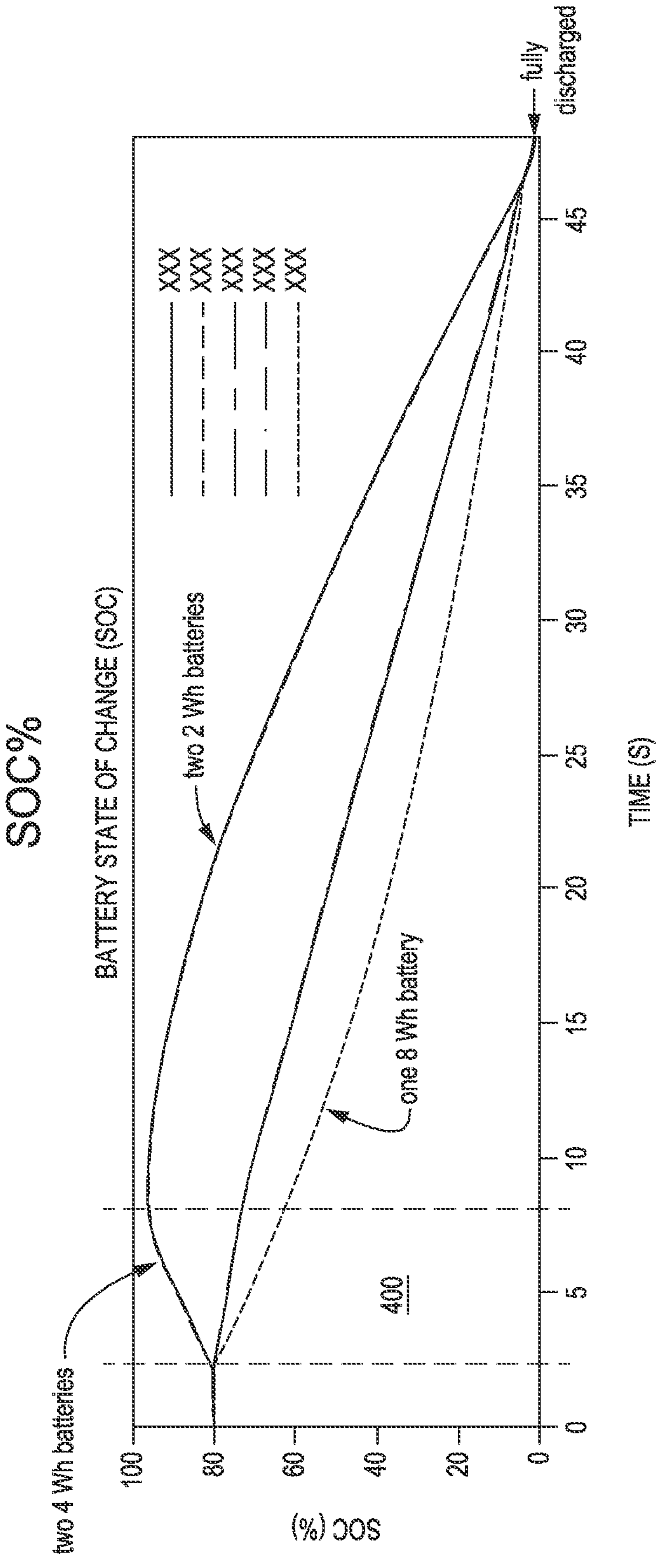
FIG. 4 is a graph of state of charge vs. time, in accordance with at least some embodiments of the present disclosure.
Figure 5:
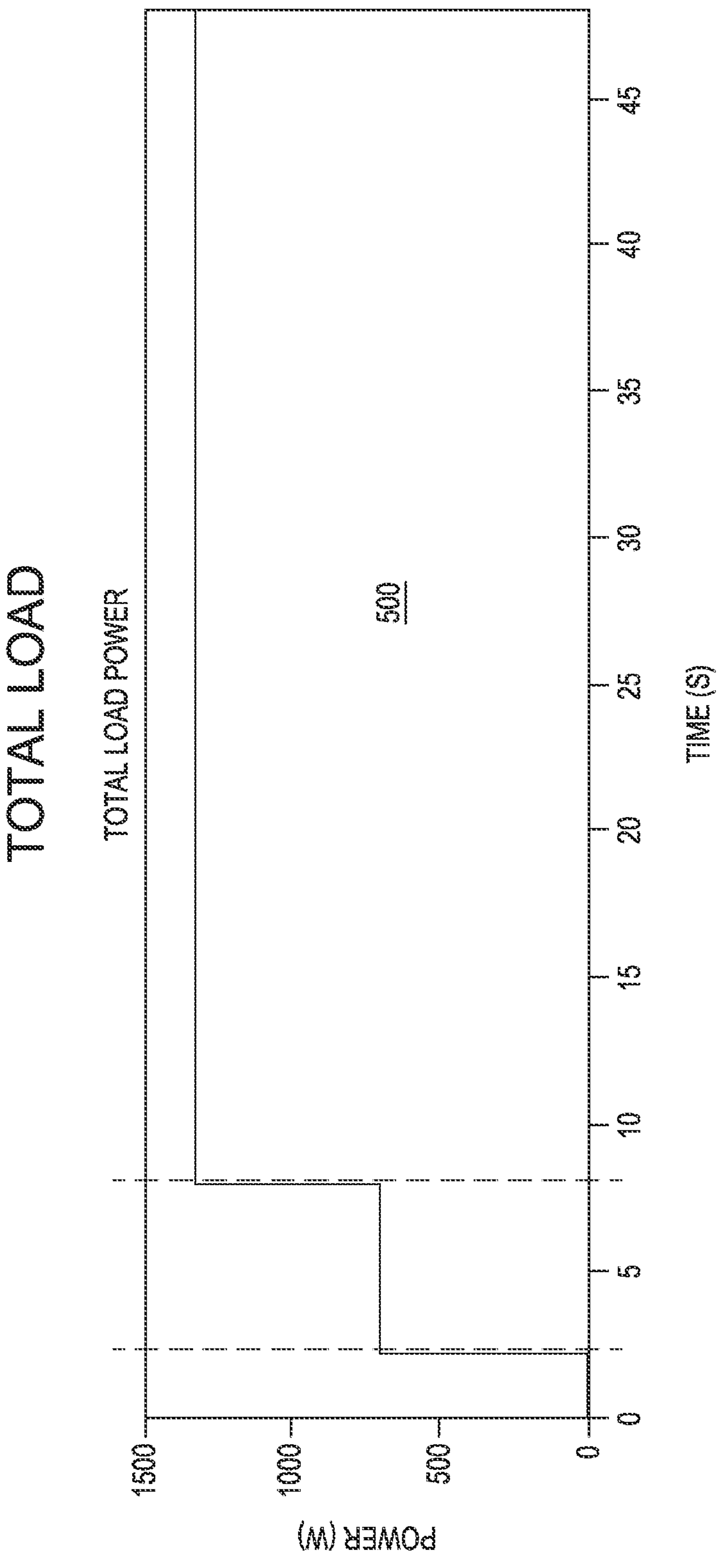
FIG. 5 is a graph of power vs. time, in accordance with at least some embodiments of the present disclosure.
Figure 6:
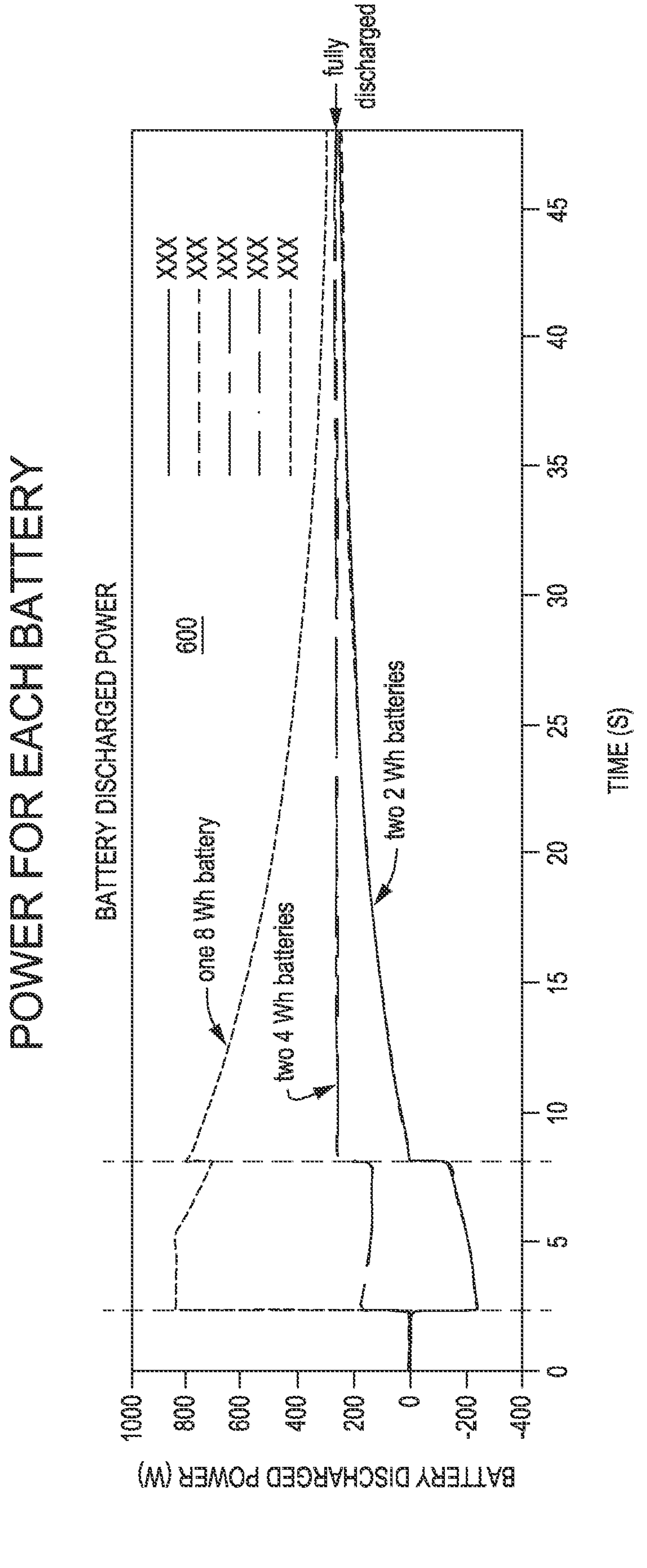
FIG. 6 is a graph of battery discharge power vs. time, in accordance with at least some embodiments of the present disclosure.

FIG. 4 is a graph 400 of state of charge vs. time, FIG. 5 is a graph 500 of power vs. time, and FIG. 6 is a graph 600 of battery discharge power vs. time, in accordance with at least one embodiment of the present disclosure. For example, a given storage system (e.g., the storage system 200) can comprise a plurality of batteries (e.g., five batteries). Two of the batteries can have a rating of 2 Wh, two of the batteries can have a rating of 4 Wh, and a fifth battery can have a rating of 8 Wh. Each of the batteries can begin with, for example, an 80% state of charge (FIG. 4). The storage system, under the control of the system controller 106, can be configured to provide power to a one or more loads (e.g., a total load) (FIG. 5). For example, during a first time period (at about 2 seconds, see phantom line), the storage system can be configured to supply about 750 W of power to match the total load using, for example, the five batteries, and the system controller 106 is configured to charge/discharge the five batteries based on a power rating and/or a C-rate of each of the batteries. For example, at about two seconds the system controller 106 can begin discharging the 8 Wh battery and the two 4 Wh batteries to power the total load and to charge the two 2 Wh batteries (see FIGS. 4-6 at 2 seconds. After about 7.5 seconds (e.g., a second time period, see phantom line), the storage system can be configured to supply about 1400 W of power to match the total load (e.g., for over 50 seconds), and the system controller 106 can be configured to begin discharging the two 2 Wh batteries to compensate for the additional power requirement. During the 50 seconds or so, the system controller 106 continues to discharge the five batteries until all of the five batteries have fully discharged, at the same time or substantially the same time, see FIGS. 4 and 6, for example.

Figure 7:
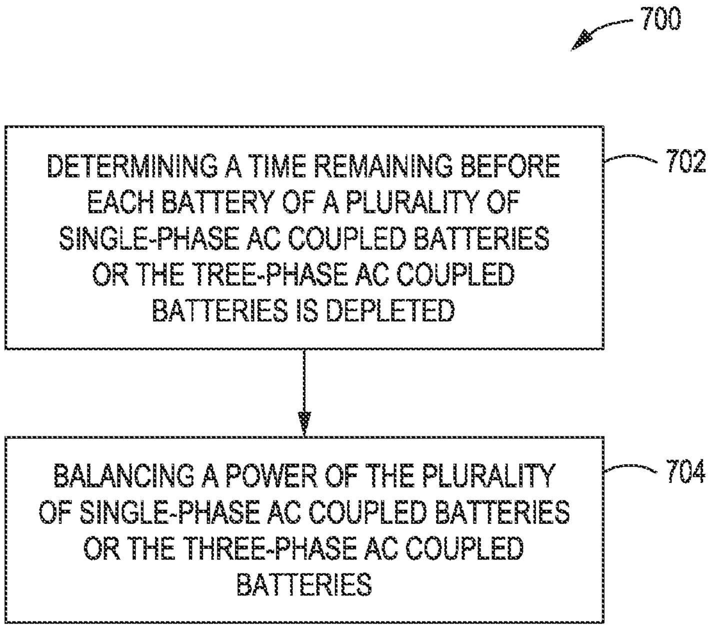
FIG. 7 is a flowchart of a method for managing a storage system configured for use with an energy management system, in accordance with at least one embodiment of the present disclosure.

FIG. 7 is a flowchart of a method 700 for managing a storage system configured for use with an energy management system, in accordance with at least one embodiment of the present disclosure.

At 702, the method 700 comprises determining a time remaining before each battery of a plurality of single-phase AC coupled batteries or the three-phase AC coupled batteries is depleted. For example, the system controller 106 can determine a SOC of each of the five batteries described above with respect to FIGS. 4-6. For example, a time remaining, $T_R$, in a battery, can be calculated using Equation (1):

$$T_R = E_R / P_C, \quad (1)$$

where $E_R$ is a remaining energy and $P_C$ is the current Power being supplied by the battery assuming that the output power remains the same. If the supplied power is not constant, then $P_C$ is the average power supplied during the remaining discharge of the battery.

Accordingly, if a state of energy is known, the time remaining can be calculated using Equation (2):

$$T_R = (SOE * E_O) / P_C, \quad (2)$$

where $E_O$ is the original capacity of the battery. To ensure that a remaining time is the same (or approximately the same) between batteries if a maximum load is applied, then $T_{RM}$ can be calculated using Equation (3):

$$T_{RM} = (SOE * EO) / PO = SOE / C_{RATE}, \quad (3)$$

Balancing $T_{RM}$ between the batteries ensures that if a maximum load is applied, the batteries will all be depleted at the same time. Thus, a balancing control term for each battery, i, can be calculated using Equation (4):

$$T_{RM_i} = SOE_i / C_{RATE_i}, \quad (4)$$

Additionally, if a state of health, SOH, reflects a fully charged energy capacity relative to an initial condition of a battery, the balancing term can be calculated using Equation (5):

$$T_{RM} = (SOE * EO * SOH) / PO = (SOE * SOH) / C_{RATE}, \quad (5)$$

Thus, when a SOC is used in place of SOE, a $T_R$ advanced proxy can be calculated using Equation (6):

$$T_{RM} = (SOC * SOH) / C_{RATE}, \quad (6)$$

Without loss in generality, the time remaining can be normalize to a time period, $T_N$ which can be chosen so that a balancing parameter is always less than one. For example, $T_N$ can be chosen to be 24 hrs and $T_R$ normalized can be calculated using Equation (7):

$$TN_{RM} = (SOC_i * SOH_i) / (C_{RATE_i} * TN), \quad (7)$$

In at least some embodiments, the system controller 106 can communicate with each BMU of the batteries to determine a state of charge of the batteries. In at least some embodiments, a single BMU can be connected to multiple batteries.

Next, at 704, the method 700 comprises balancing a power of the plurality of single-phase AC coupled batteries or the three-phase AC coupled batteries. For example, while supplying power to a total load, the system controller 106 can continually communicate with the BMU to monitor a state of charge of each battery and, using one or more of Equations (1)-(7), can charge and discharge each battery as needed, until all of the batteries are completely discharged, at the same time or substantially the same time.

Figure 8:
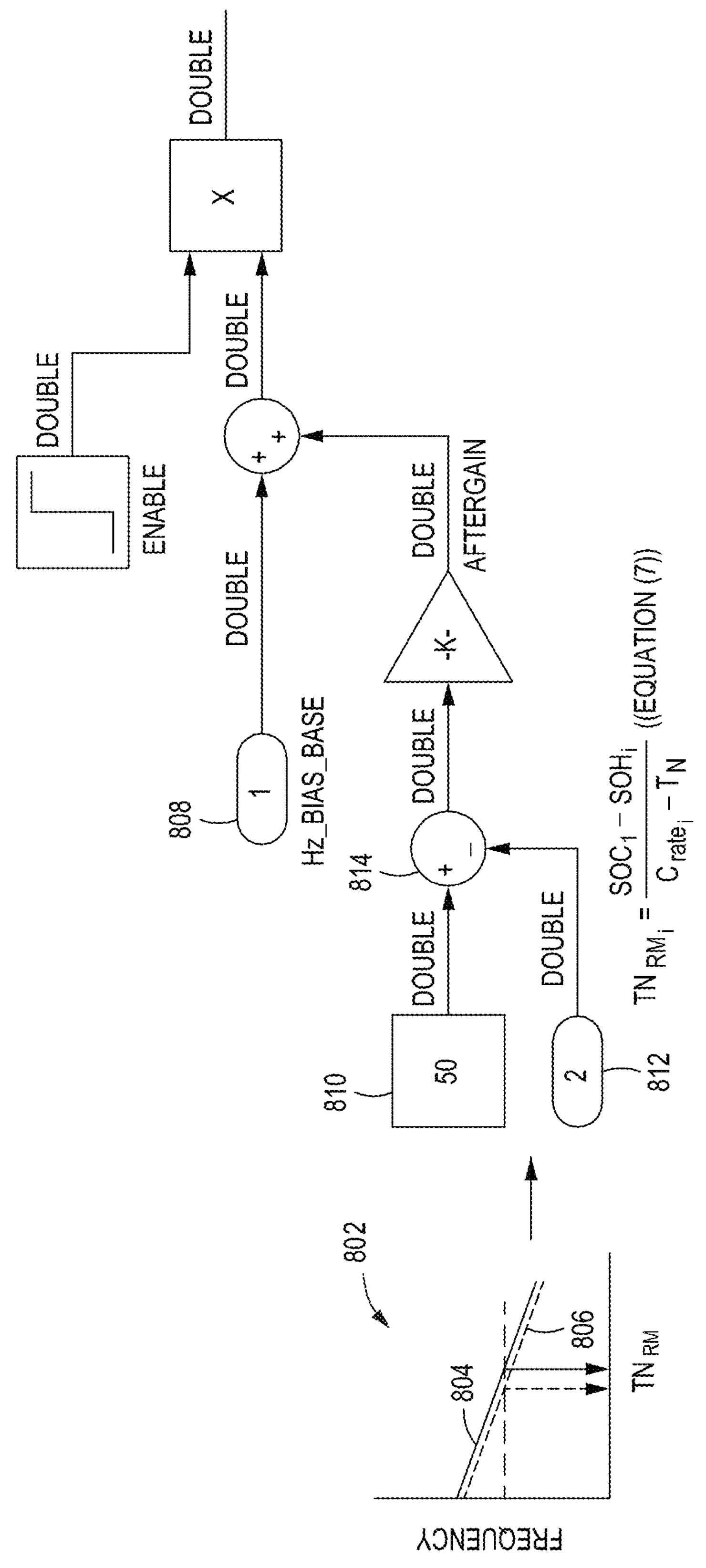
FIG. 8 is a diagram of droop control configured for use with a storage system, in accordance with at least one embodiment of the present disclosure.

In at least some embodiments, during 702 or 704 the system controller 106 can perform frequency droop to facilitate ensuring that all of the batteries run out of energy at the same time or substantially the same time. 1. For example, in frequency droop control, there is a characteristic in AC systems where an output power can be a function of frequency. For example, if a frequency is increased, then the output power increases. In the case of a system that is powered by a battery, increasing the output power decreases the time to deplete the battery. That is, the higher the frequency, then the lower the time to depletion as illustrated by graph 802. To remain in sync, all AC sources (e.g., the battery 120) in a system must operate at the same frequency. Each AC source has a controller that regulates the AC source frequency to the bus frequency, see the dashed line in the graph 802 showing a state where an AC source 804 and an AC source 806 (two different AC sources on the same bus) operate at the same frequency. Due to the characteristic of the AC source 806, the AC source 806 discharges at a shorter time than the AC source 804, which can be changed by adding a bias to the AC source controller frequency which will move the curve up or down. The bias can be implemented as shown in FIG. 8. For example, 808 represents a variable controller bias to maintain a bus frequency. 810 sets a fixed offset for the bias, and 812 adds an adjustable bias which is a function of a time to depletion TN. As illustrated in FIG. 8, the bias is actually a negative bias (see the negative sign in the adder 814). Thus, as the TN is increased, actual bias is decreased leading to a lower frequency and lower output power from the AC source. By appropriate system controller design, using such a droop control method, each AC source (e.g., the AC source 804 and the AC source 806) will self-adjust eventually so that each AC source match to the same TN so that all of the batteries deplete at the same time (as shown in FIG. 4). In at least some embodiments, frequency droop control is based on a C-rate of the batteries, a power rating of the batteries, a state of charge of the batteries, a state of health of the batteries, etc. For example, as illustrated in FIG. 8, the inventors have found an improved control algorithm that balances a weighted SOC based on a C-rate and SOH. For example, the $TN_{RM}$ can be calculated using equation (7) and used by the system controller 106 to perform frequency droop control in a conventional manner to facilitate ensuring that all of the batteries run out of energy at the same time or substantially the same time. Suitable frequency droop control techniques that can be used in conjunction with the methods and apparatus described herein can include the frequency droop control techniques disclosed in commonly-owned U.S. Pat. No. 10,951,037 and U.S. Patent Publication No. 20210296903.

In at least some embodiments, the batteries can be the same as each other or different from each other. For example, some of the batteries can have the same C-rate, power rating, and/or state of charge as each other and some of the batteries can have a different C-rate, power rating, and/or state of charge from each other. The system controller 106 takes the C-rate, power rating, and/or state of charge of each of the batteries and uses that information during operation.

Additionally, in at least some embodiments, as noted above, the system controller 106 can be configured to charge batteries having less time remaining before depletion using batteries having more time remaining before depletion.

While the foregoing is directed to embodiments of the present disclosure, other and further embodiments of the disclosure may be devised without departing from the basic scope thereof, and the scope thereof is determined by the claims that follow.

The invention claimed is:

1. A storage system on site of an energy management system, comprising:

a plurality of single-phase AC coupled batteries or three-phase AC coupled batteries configured to supply power to a load connected to the energy management system; and a controller of the storage system configured to determine a time remaining for supplying power to the load before each battery of the plurality of single-phase AC coupled batteries or the three-phase AC coupled batteries is depleted and to discharge and charge at a first time at least one of the plurality of single-phase AC coupled batteries or three-phase AC coupled batteries based on a determined amount of power to match the load at the first time period based on a state-of-charge relative to each battery of the plurality of single-phase AC coupled batteries or the three-phase AC coupled batteries and perform frequency droop control based on a weighted SOC based on at least one of a C-rate or SOH.

2. The storage system of claim 1, wherein the controller is further configured to perform the frequency droop control such that all of the plurality of single-phase AC coupled batteries or the three-phase AC coupled batteries run out of energy at the same time.

3. The storage system of claim 1, wherein the weighted SOC is based on a C-rate and SOH and calculated using the equation $$TN_{RM}=(SOC_i*SOH_i)/(C_{RATEi}*TN).$$

4. The storage system of claim 1, wherein at least some of the plurality of single-phase AC coupled batteries or three-phase AC coupled batteries have the same C-rate as each other and at least some of the plurality of single-phase AC coupled batteries or three-phase AC coupled batteries have a different C-rate from each other.

5. The storage system of claim 1, wherein the controller is further configured to charge batteries having less time remaining before depletion using batteries having more time remaining before depletion.

6. A method for managing a storage system configured for use with an energy management system, comprising:

determining a time remaining for supplying power to a load connected to the energy management system via a plurality of single-phase AC coupled batteries or the three-phase AC coupled batteries before each battery of the plurality of single-phase AC coupled batteries or the three-phase AC coupled batteries is depleted and to discharge and charge at a first time at least one of the plurality of single-phase AC coupled batteries or three-phase AC coupled batteries based on a determined amount of power to match the load at the first time period based on a state-of-charge relative to each battery of the plurality of single-phase AC coupled batteries or the three-phase AC coupled batteries and performing frequency droop control based on a weighted SOC based on at least one of a C-rate or SOH.

7. The method of claim 6, further comprising performing the frequency droop control such that all of the plurality of single-phase AC coupled batteries or the three-phase AC coupled batteries run out of energy at approximately the same time.

8. The method of claim 6, wherein the weighted SOC is based on a C-rate and SOH and is calculated using the equation $$TN_{RM}=(SOC_i*SOH_i)/(C_{RATEi}*TN).$$

9. The method of claim 6, wherein at least some of the plurality of single-phase AC coupled batteries or three-phase AC coupled batteries have the same C-rate as each other and at least some of the plurality of single-phase AC coupled batteries or three-phase AC coupled batteries have a different C-rate from each other.

10. The method of claim 6, wherein further comprising charging batteries having less time remaining before depletion using batteries having more time remaining before depletion.

11. A non-transitory computer readable storage medium having stored thereon instructions that when executed by a processor perform a method for managing a storage system, comprising:

determining a time remaining for supplying power to a load connected to the energy management system via a plurality of single-phase AC coupled batteries or the three-phase AC coupled batteries is depleted and to discharge and charge at a first time at least one of the plurality of single-phase AC coupled batteries or three-phase AC coupled batteries based on a determined amount of power to match the load at the first time period based on a state-of-charge relative to each battery of the plurality of single-phase AC coupled batteries or the three-phase AC coupled batteries and performing frequency droop control based on a weighted SOC based on at least one of a C-rate or SOH.

12. The non-transitory computer readable storage medium of claim 11, further comprising performing the frequency droop control such that all of the plurality of single-phase AC coupled batteries or the three-phase AC coupled batteries run out of energy at approximately the same time.

13. The non-transitory computer readable storage medium of claim 11, wherein the weighted SOC is based on a C-rate and SOH and is calculated using the equation $$TN_{RM}=(SOC_i*SOH_i)/(C_{RATEi}*TN).$$

14. The non-transitory computer readable storage medium of claim 11, wherein at least some of the plurality of single-phase AC coupled batteries or three-phase AC coupled batteries have the same C-rate as each other and at least some of the plurality of single-phase AC coupled batteries or three-phase AC coupled batteries have a different C-rate from each other.

15. The non-transitory computer readable storage medium of claim 11, wherein further comprising charging batteries having less time remaining before depletion using batteries having more time remaining before depletion.

* * * * *